US008299691B2

(12) United States Patent
Grimm

(10) Patent No.: US 8,299,691 B2
(45) Date of Patent: Oct. 30, 2012

(54) ADVANCED SYNJET COOLER DESIGN FOR LED LIGHT MODULES

(75) Inventor: Daniel N. Grimm, Round Rock, TX (US)

(73) Assignee: Nuventix, Inc., Austin, TX (US)

( * ) Notice: Subject to any disclaimer, the term of this patent is extended or adjusted under 35 U.S.C. 154(b) by 158 days.

(21) Appl. No.: 12/503,832

(22) Filed: Jul. 15, 2009

(65) Prior Publication Data

US 2010/0039012 A1 Feb. 18, 2010

Related U.S. Application Data

(60) Provisional application No. 61/134,966, filed on Jul. 15, 2008.

(51) Int. Cl.
*H05K 7/20* (2006.01)

(52) U.S. Cl. ........................... 313/35; 361/695; 361/697

(58) Field of Classification Search .................... 313/35; 361/695, 697
See application file for complete search history.

(56) References Cited

U.S. PATENT DOCUMENTS

| | | | | |
|---|---|---|---|---|
| 5,576,932 | A * | 11/1996 | Bishop et al. | 361/697 |
| 6,123,145 | A * | 9/2000 | Glezer et al. | 165/104.33 |
| 2006/0196638 | A1* | 9/2006 | Glezer et al. | 165/80.3 |
| 2008/0009187 | A1* | 1/2008 | Grimm et al. | 439/595 |
| 2008/0219007 | A1* | 9/2008 | Heffington et al. | 362/294 |

* cited by examiner

*Primary Examiner* — Nimeshkumar Patel
*Assistant Examiner* — Christopher Raabe
(74) *Attorney, Agent, or Firm* — John A. Fortkort; Fortkort & Houston P.C.

(57) ABSTRACT

An LED light source (101) is provided which comprises an LED module (103) containing an LED (113); a heat sink (107) disposed about the periphery of the LED module; and a tabular synthetic jet ejector (105) disposed on said LED module and being adapted to direct a plurality of synthetic jets across surfaces of said heat sink.

28 Claims, 13 Drawing Sheets

ADVANCED SYNJET COOLER DESIGN FOR LED LIGHT MODULES

CROSS REFERENCE TO RELATED APPLICATION

This application claims the benefit of priority from U.S. Provisional Application No. 61/134,966 filed Jul. 15, 2008, having the same title, and having the same inventors, and which is incorporated herein by reference in its entirety.

FIELD OF THE DISCLOSURE

The present disclosure relates generally to thermal management systems for LEDs, and more specifically to LED modules containing synthetic jet ejectors.

BACKGROUND OF THE DISCLOSURE

A variety of thermal management devices are known to the art, including conventional fan based systems, piezoelectric systems, and synthetic jet actuators. The latter type of system has emerged as a highly efficient and versatile solution where thermal management is required at the local level. In some applications, synthetic jet actuators are utilized in conjunction with a conventional fan based system to produce hybrid thermal management systems. In such hybrid systems, the fan based system provides a global flow of fluid through the device being cooled, and the synthetic jet ejectors provide localized cooling for hot spots and also augment the global flow of fluid through the device by perturbing boundary layers.

Various examples of synthetic jet actuators, and thermal management systems based on these devices, are known to the art. Some examples include those disclosed in U.S. 20070141453 (Mahalingam et al.) entitled "Thermal Management of Batteries using Synthetic Jets"; U.S. 20070127210 (Mahalingam et al.), entitled "Thermal Management System for Distributed Heat Sources"; 20070119575 (Glezer et al.), entitled "Synthetic Jet Heat Pipe Thermal Management System"; 20070119573 (Mahalingam et al.), entitled "Synthetic Jet Ejector for the Thermal Management of PCI Cards"; 20070096118 (Mahalingam et al.), entitled "Synthetic Jet Cooling System for LED Module"; 20070081027 (Beltran et al.), entitled "Acoustic Resonator for Synthetic Jet Generation for Thermal Management"; and 20070023169 (Mahalingam et al.), entitled "Synthetic Jet Ejector for Augmentation of Pumped Liquid Loop Cooling and Enhancement of Pool and Flow Boiling".

SUMMARY OF THE DISCLOSURE

In one aspect, an LED light source is provided which comprises (a) an LED module containing an LED; (b) a heat sink disposed about the periphery of the LED module; and (c) a tabular synthetic jet ejector disposed on said LED module and being adapted to direct a plurality of synthetic jets across surfaces of said heat sink.

In another aspect, a light source is provided which comprises (a) an LED module having first, second and third surfaces; (b) a synthetic jet ejector disposed upon, or adjacent to, said first surface; (c) a light-emitting region disposed on said second surface; and (d) a heat sink disposed on said third surface, said heat sink comprising a plurality of fins and having a plurality of channels formed by adjacent fins; wherein said synthetic jet ejector operates to direct each of a plurality of synthetic jets along the longitudinal axis of one of said channels.

DETAILED DESCRIPTION

Figure 1:
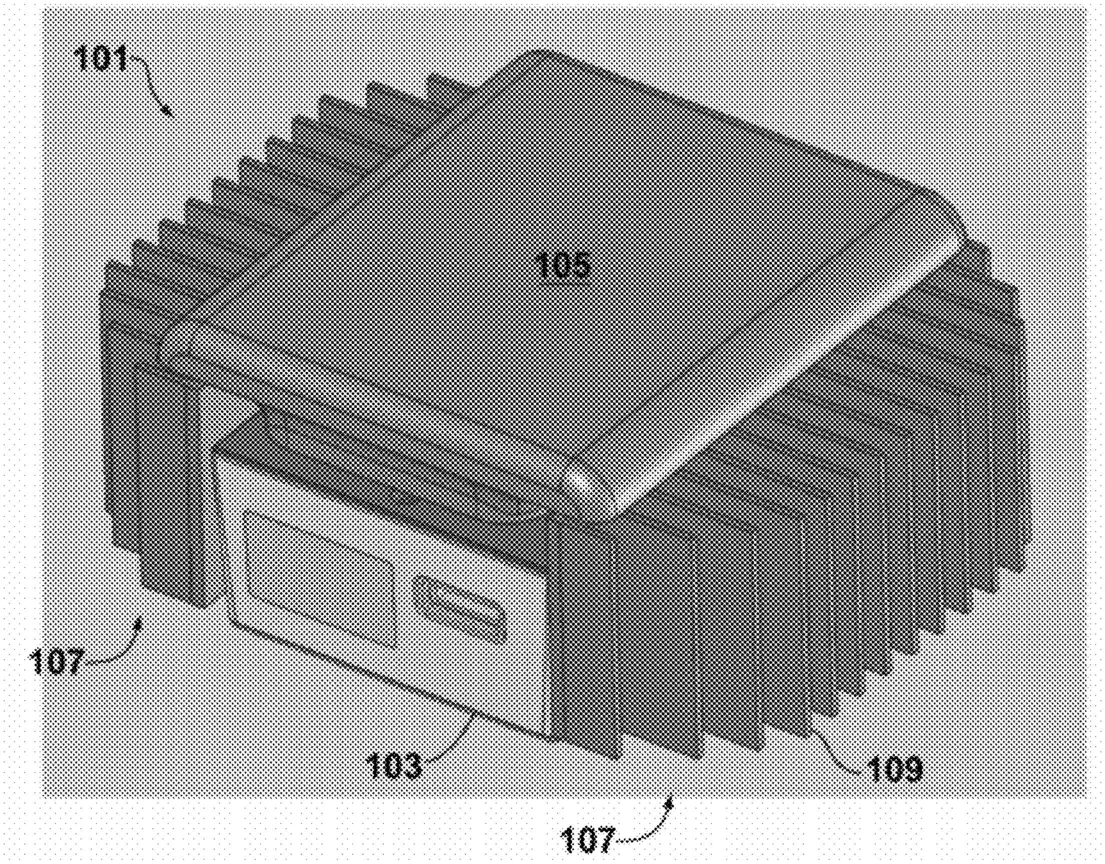
FIG. 1 is a perspective view of a first embodiment of a thermally managed LED module in accordance with the teachings herein.
Figure 2:
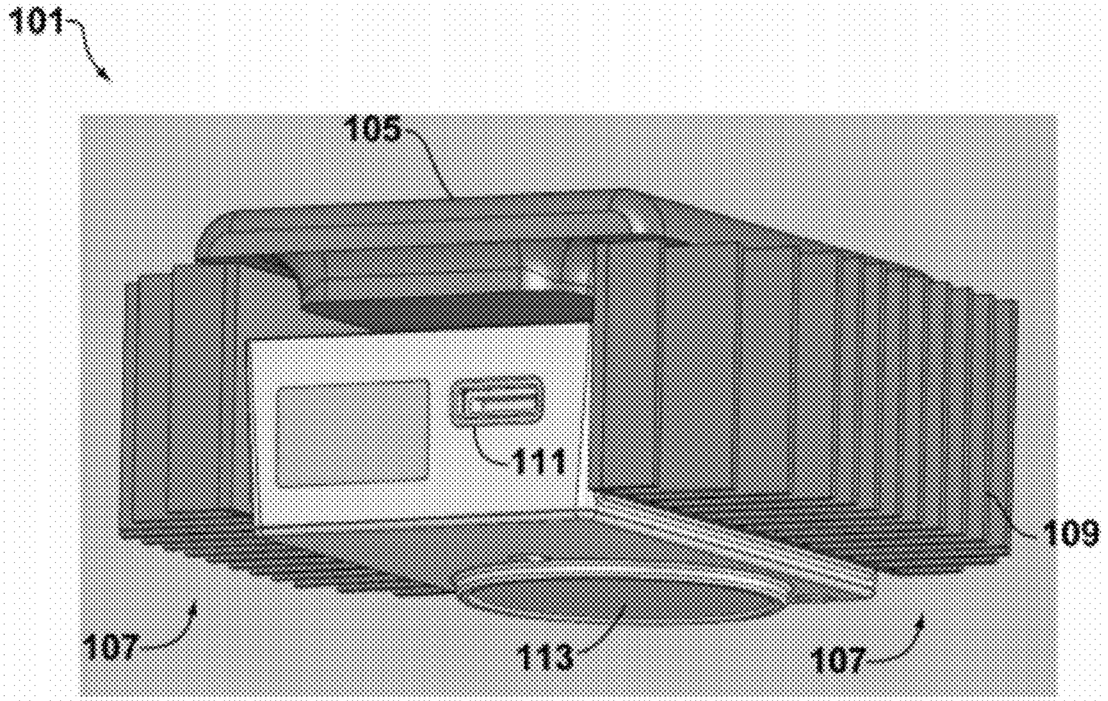
FIG. 2 is a perspective view of the thermally managed LED module of FIG. 1.
Figure 3:
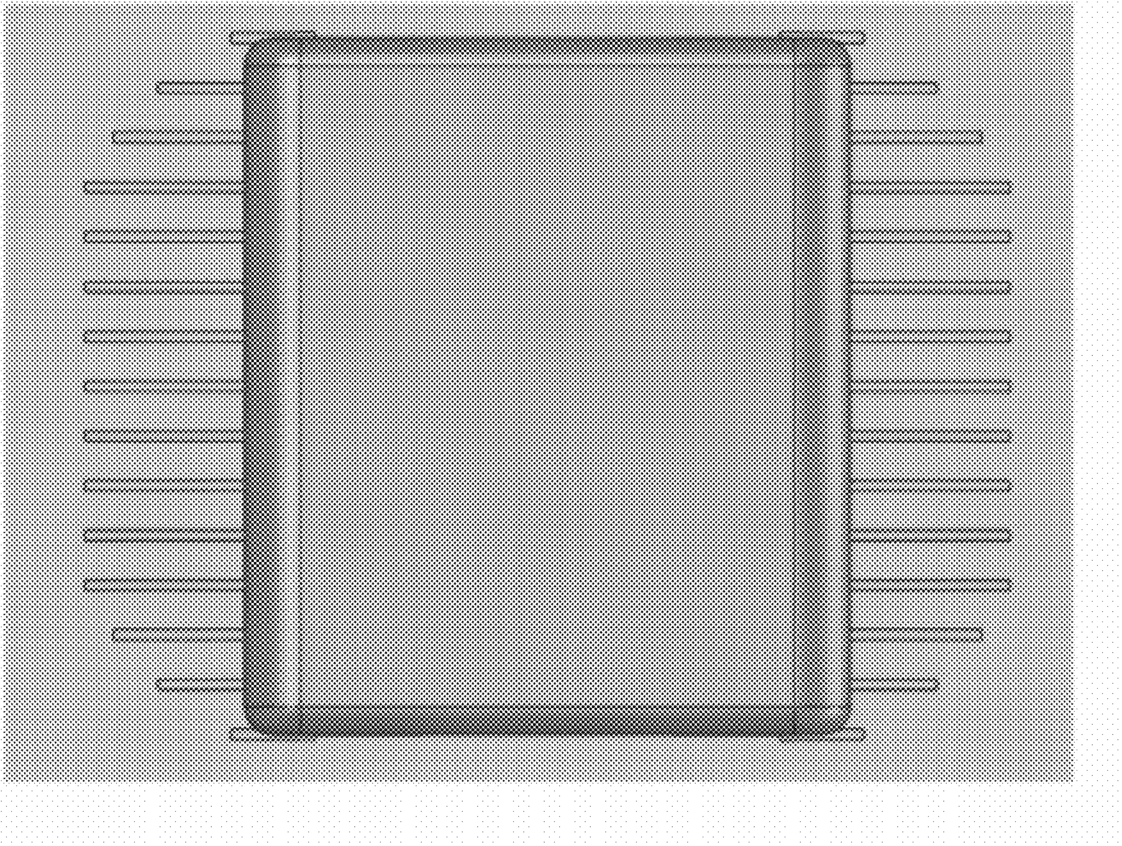
FIG. 3 is a top view of the thermally managed LED module of FIG. 1.
Figure 4:
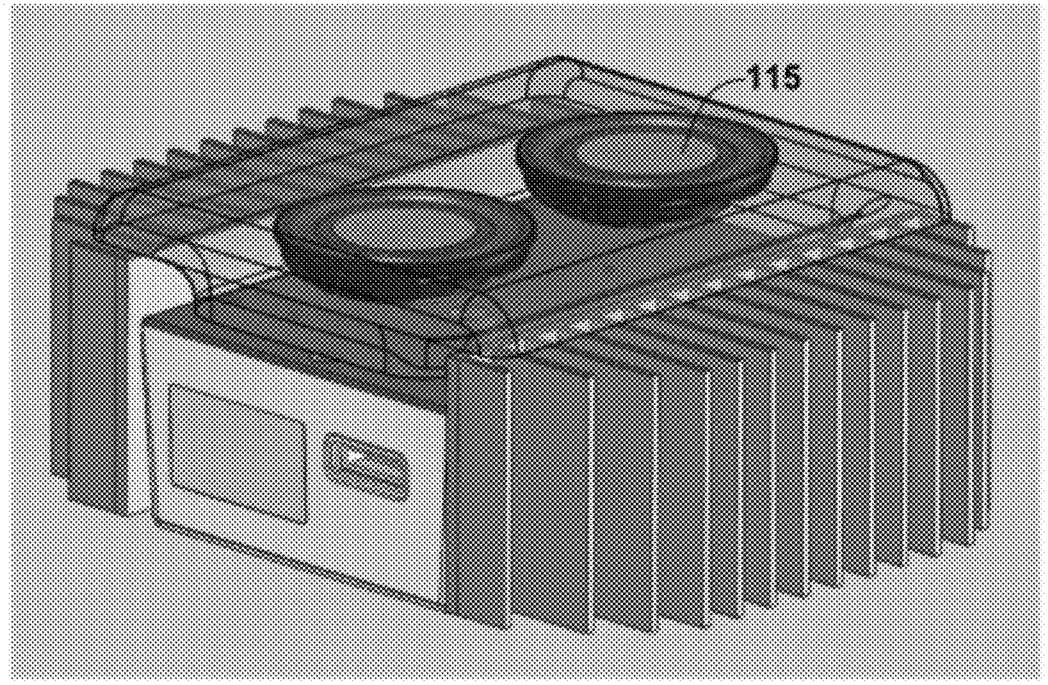
FIG. 4 is a perspective view (partially transparent to show the inner details) of the thermally managed LED module of FIG. 1.

Despite the foregoing advances, a need still exists in the art for new thermal management solutions. In the case of LED light sources in particular, the increasing power and compactness of LED semiconductor devices has strained existing thermal management technologies, even while specific lighting applications themselves impose significant design constraints that prevent previous thermal management solutions from being scaled up to meet those needs. Accordingly, a need exists in the art for new thermal management solutions which are suitable for use in conjunction with LED light sources.

It has now been found that the foregoing needs may be met with the devices and methodologies herein. These devices and methodologies leverage the flexibility of synthetic jet ejectors to create compact LED light sources with excellent thermal management capabilities.

FIGS. 1-6 illustrate a first particular, non-limiting embodiment of an LED light source made in accordance with the teachings herein. With reference thereto, an LED light source 101 is depicted which is equipped with an LED module 103, a synthetic jet ejector 105, and a heat sink 107 equipped with a plurality of fins 109. The LED module 103 contains one or more LEDs (not shown) which operate to generate light of a desired spectral footprint.

In the particular embodiment depicted, the LED module 103 is essentially polyhedral in shape, and more specifically, is essentially prismatic in shape. The LED module 103 is equipped on one surface thereof with a port 111 (see FIG. 2)

which allows it to be connected to a power source, and is equipped on another surface with a light emitting portion 113.

The synthetic jet ejector 105 in the particular embodiment depicted is generally tabular in shape. The central portion thereof houses a pair of synthetic jet actuators 115 (see FIG. 4) which are in fluidic communication with a plurality of apertures 116 (see FIG. 6) disposed about the periphery of the synthetic jet ejector 105.

In some embodiments, both actuators are in fluidic communication with all of the apertures, preferably by way of a central plenum. In other embodiments, the interior of the actuators may be segregated or provided with partitions, flow control devices or features such that one actuator is in fluidic communication with a first set of apertures, while the other actuator is in fluidic communication with a second set of apertures. In such an embodiment, for example, the first actuator may be in fluidic communication with the apertures on a first side of the device and the second actuator may be in fluidic communication with the apertures on a second side of the device. In another such embodiment, the first actuator may be in fluidic communication with the apertures on one half of each side of the device, while the second actuator is in fluidic communication with the remainder of the apertures.

The synthetic jet actuators depicted in this particular embodiment are acoustic actuators having electromagnetically driven diaphragms. These actuators are described in detail in commonly assigned U.S. Ser. No. 12/156,846 (Heffington et al.) (see especially FIGS. 10 and 26-31 thereof), which is incorporated herein by reference in its entirety. Of course, it will be appreciated that, in other embodiments, piezoelectric actuators may be utilized instead. The actuators 115 may also be disposed in various orientations (e.g., upside down). In some embodiments, the actuators 115 and/or the LED light source 101 may be assembled into single or multiple stacked configurations as described, for example, in commonly assigned U.S. Ser. No. 12/288,144 (Booth et al.), which is incorporated herein by reference in its entirety.

The heat sink 107 in this particular embodiment consists of first 108 and second 110 sections (see FIG. 6) which are disposed about the periphery of the device, and which comprise a plurality of fins 109. As noted above, the synthetic jet ejector 105 contains a plurality of apertures 116, each of which is adapted to direct a synthetic jet into a channel formed by a pair of opposing fins 109. The fins 109 of the heat sink 107 in this particular embodiment are profiled. This permits the heat sink to fit through round apertures, while requiring minimum headroom. Of course, it will be appreciated that various other fin profiles may also be used.

In use, the synthetic jet ejector 105 produces synthetic jets in the channels defined by adjacent fins 109 of the heat sink 107. The turbulence created by these jets disrupts the boundary layers formed along the surfaces of the fins 109, and hence facilitates heat exchange between the heat sink 107 and the external environment. This, in turn, provides efficient cooling of the LED module 103 which is in thermal contact with the heat sink 107.

Figure 5:
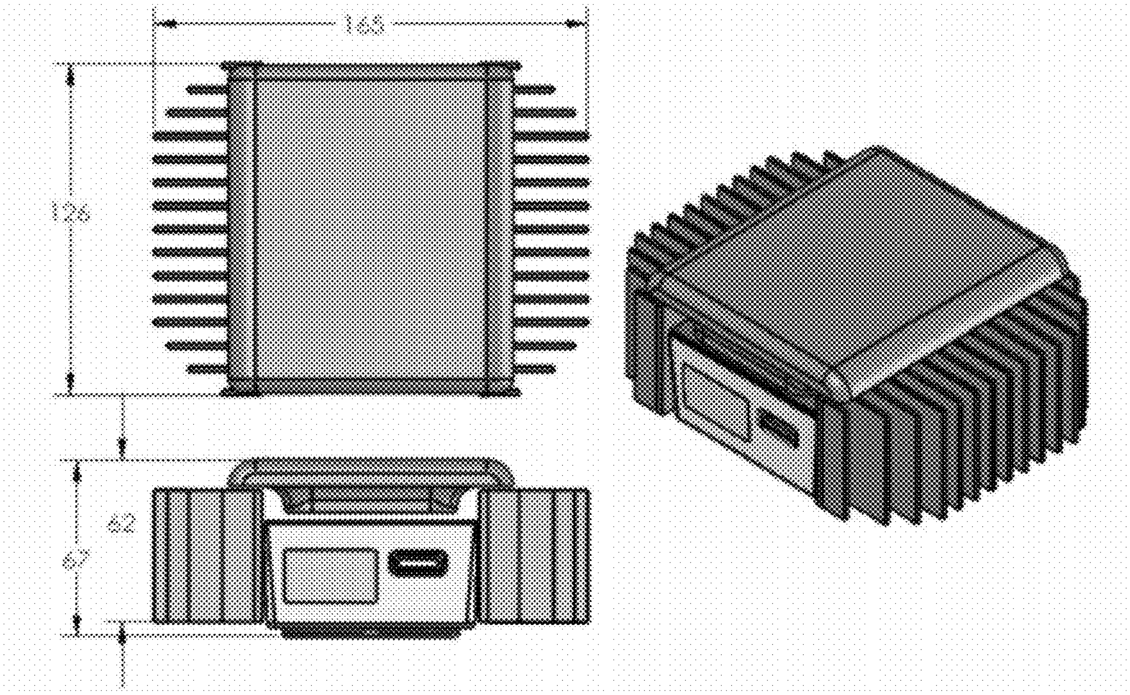
FIG. 5 is an illustration depicting some typical dimensions of the thermally managed LED module of FIG. 1.
Figure 6:
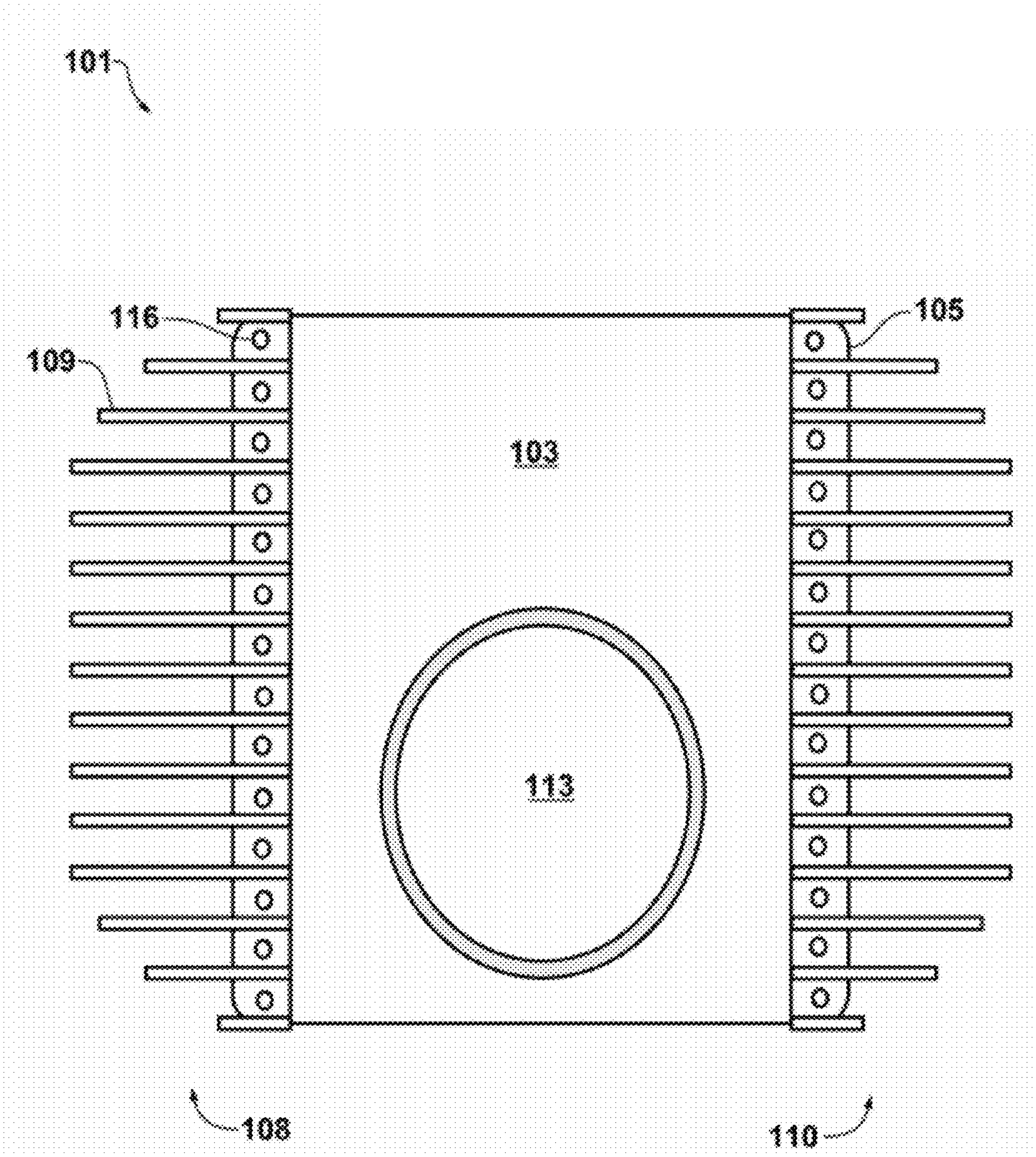
FIG. 6 is a bottom view of the thermally managed LED module of FIG. 1.
Figure 7:
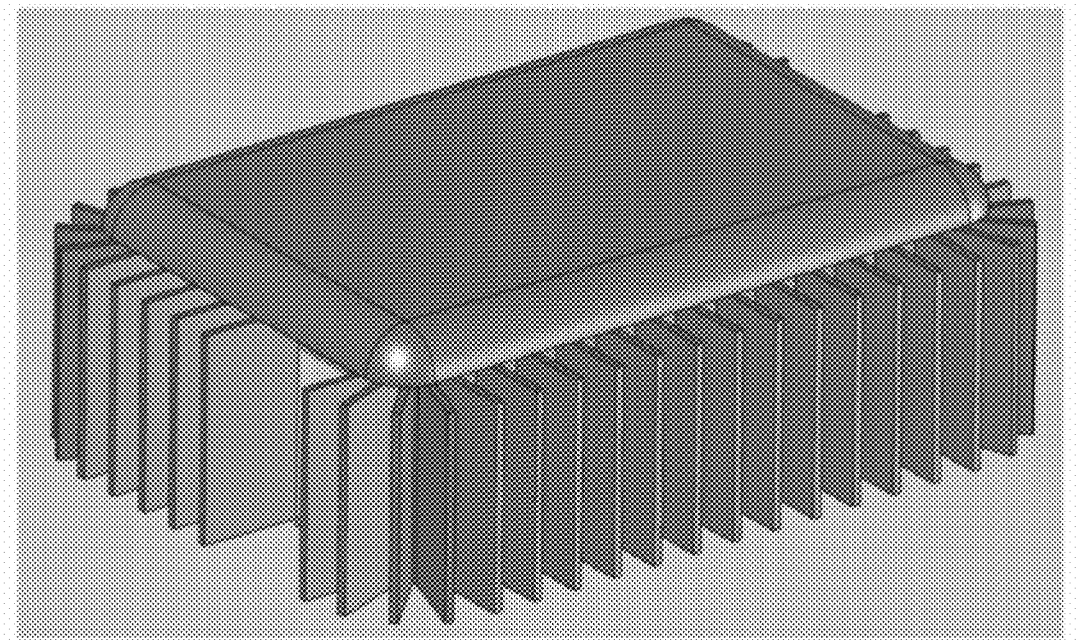
FIG. 7 is a perspective view of a second embodiment of a thermally managed LED module in accordance with the teachings herein.
Figure 8:
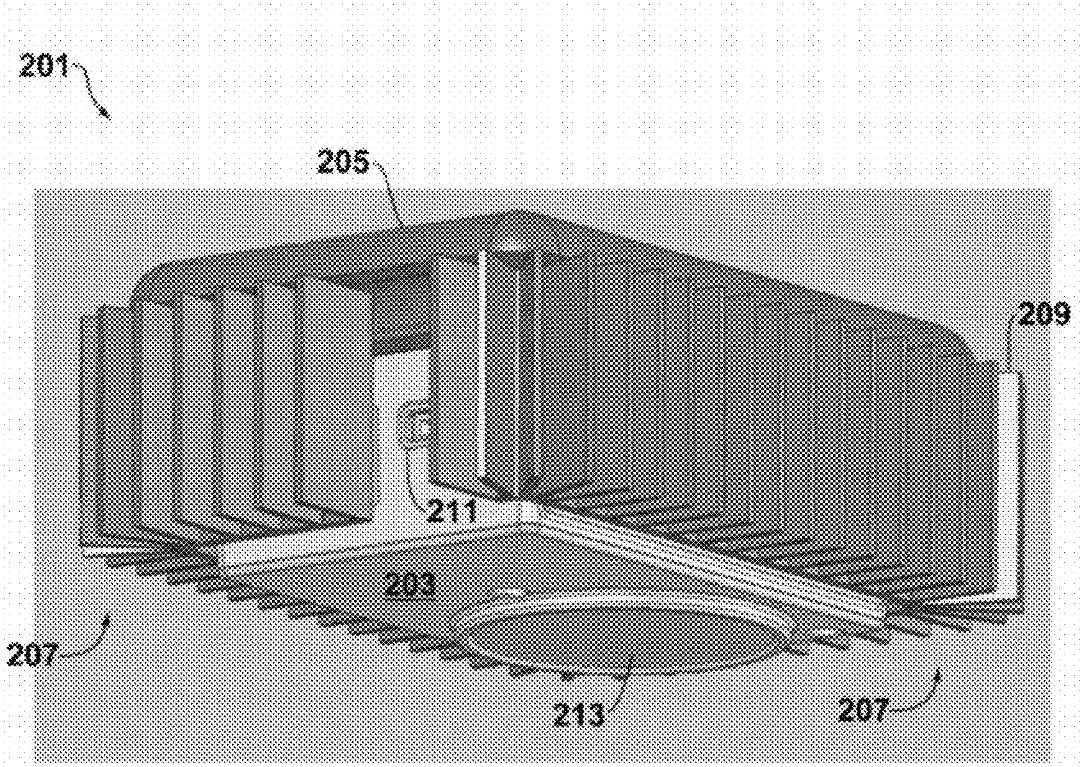
FIG. 8 is a perspective view of the thermally managed LED module of FIG. 7.
Figure 9:
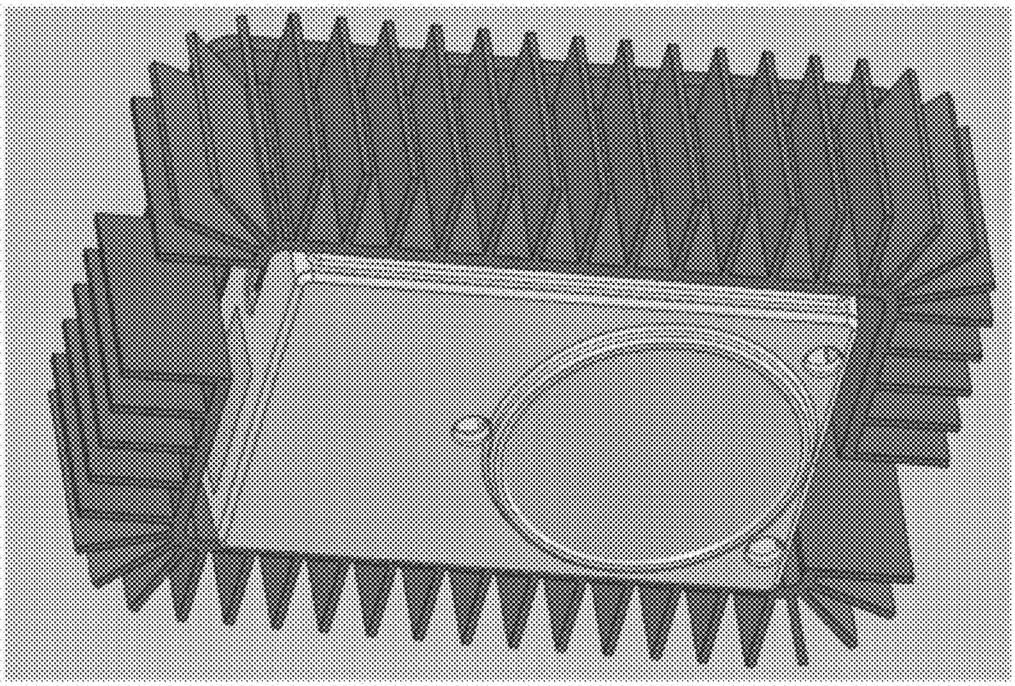
FIG. 9 is a perspective view of the thermally managed LED module of FIG. 7.
Figure 10:
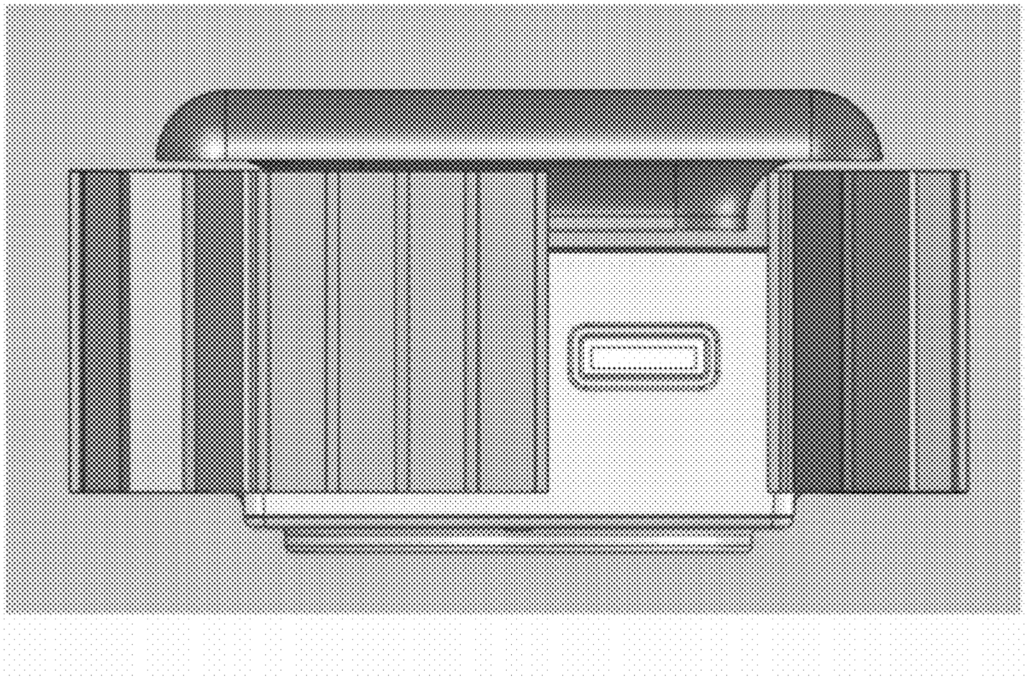
FIG. 10 is a side view of the thermally managed LED module of FIG. 7.
Figure 11:
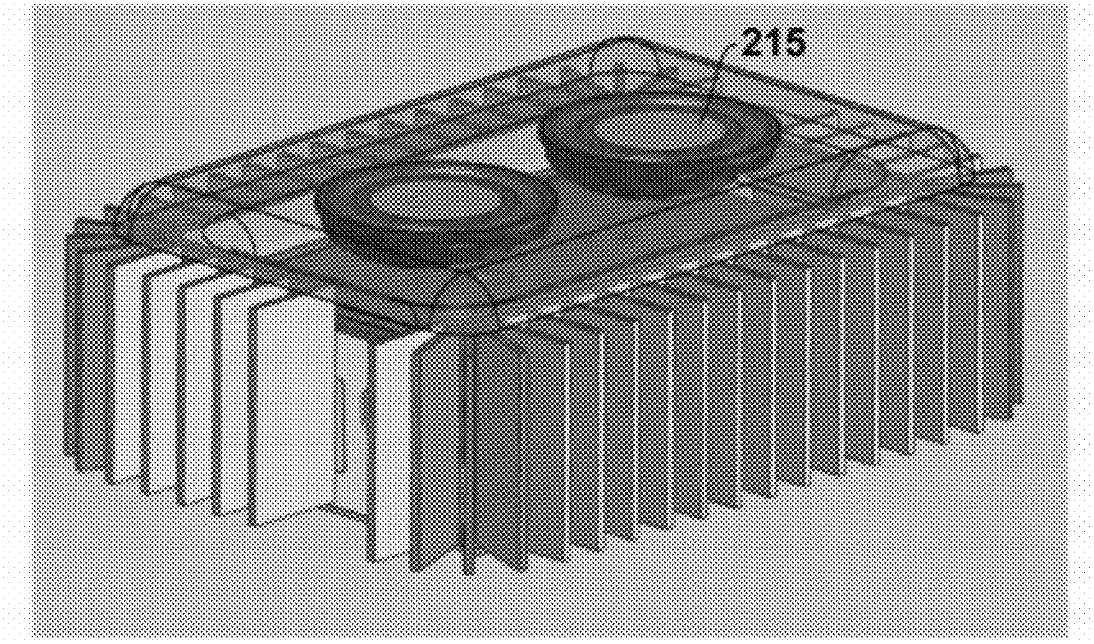
FIG. 11 is a perspective view (partially transparent to show the inner details) of the thermally managed LED module of FIG. 7.
Figure 12:
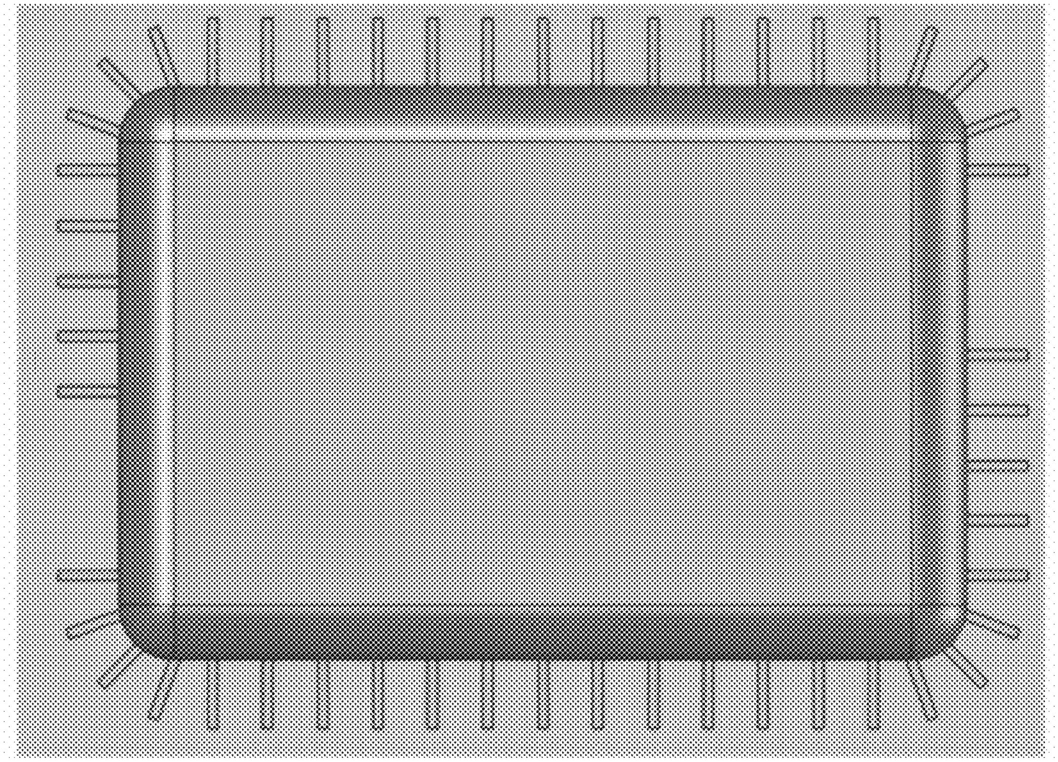
FIG. 12 is a top view of the thermally managed LED module of FIG. 6.

FIG. 5 depicts some typical, non-limiting dimensions (in cm) of the LED light source 101 depicted in FIGS. 1-6. It will be appreciated, of course, that the actual dimensions of an embodiment of an LED light source made in accordance with the teachings herein may vary, and may be chosen, for example, to suit the particular application for which it is intended.

FIGS. 7-13 depict a second particular, non-limiting embodiment of an LED light source in accordance with the teachings herein. The LED light source 201 depicted therein is equipped with an LED module 203, a synthetic jet ejector 205 and a heat sink 207. The heat sink 207 in this particular embodiment consists of a singular unit which is disposed about the periphery of the device, and which comprises a plurality of fins 209. The synthetic jet ejector 205 contains a pair of synthetic jet actuators 215 (see FIG. 11) and a plurality of apertures (not shown) which direct synthetic jets into the channel formed by opposing pairs of fins 209. The LED module 203 contains a port 211 which allows it to be connected to a power source. The LED module 203 is also equipped with a light emitting portion 213. Several variations and modifications to this embodiment are possible, including those noted with respect to the first embodiment described above.

Figure 13:
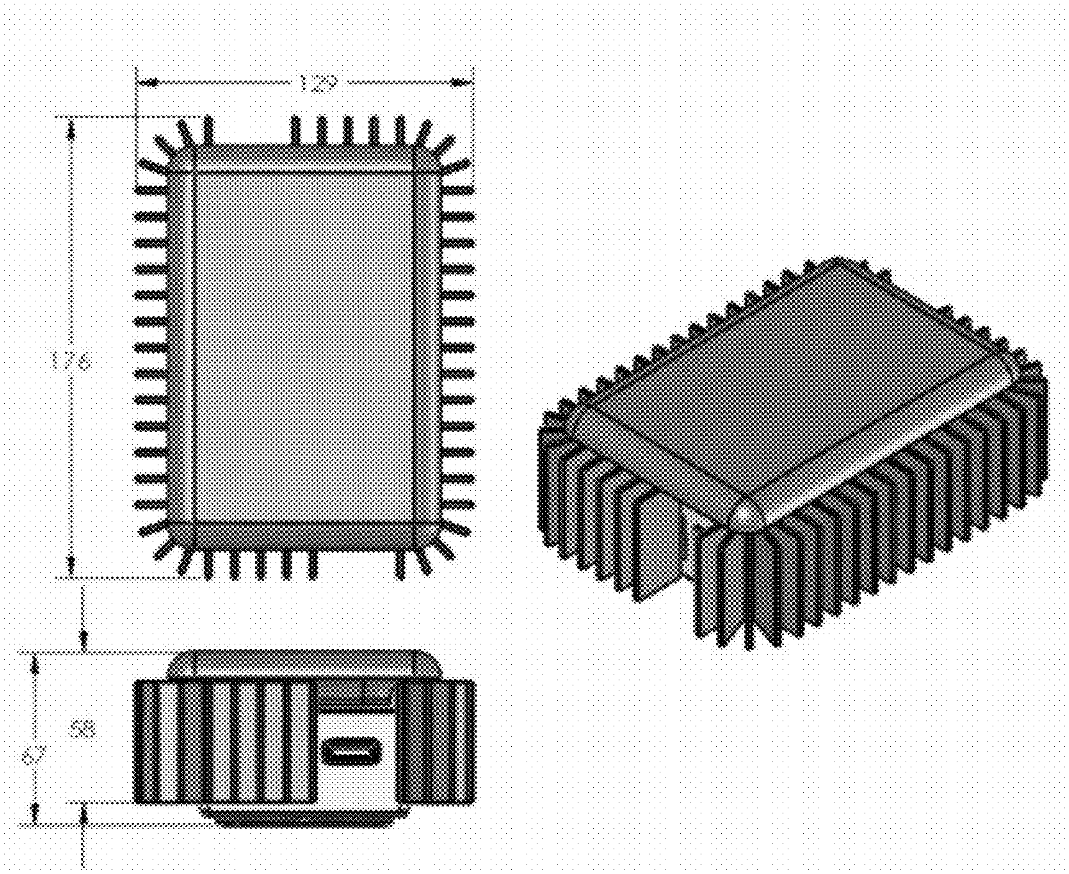
FIG. 13 is an illustration depicting some typical dimensions of the thermally managed LED module of FIG. 7.

FIG. 13 depicts some typical, non-limiting dimensions (in cm) of the LED light source 201 depicted in FIGS. 7-12. It will be appreciated, of course, that the actual dimensions of an embodiment of an LED light source made in accordance with the teachings herein may vary and may be chosen, for example, to suit the particular application for which it is intended.

Various modifications may be made to the particular embodiments of the devices and methodologies described above without departing from the scope of the teachings herein. For example, while the embodiments described herein feature a synthetic jet ejector having two actuators, it will be appreciated that other embodiments of the devices made in accordance with the teachings herein may feature a single actuator, or may be equipped with more than two actuators.

Moreover, while the specific embodiments of the LED light sources described herein are essentially polyhedral in shape, it will be appreciated that LED light sources may be made in accordance with the teachings herein which have various other shapes and geometries. By way of example, LED light sources may be constructed in accordance with the teachings herein which are conical, tubular, columnar, polygonal, or irregular in shape. It will further be appreciated that the synthetic jet ejector may also assume a variety of geometries.

It will further be appreciated that the number and type of LEDs used in the devices described herein may vary from one application to another. For example, in some applications, a plurality of LEDs, each of which emits essentially monochromatic radiation, may be utilized in combination with each other and with suitable color mixing within a single LED light source to produce a device having a desired spectral footprint, such as white light.

It is also to be noted that various types of heat spreaders and heat pipes may be utilized in the devices and methodologies described herein. For example, a heat spreader or heat pipe may be utilized to transfer heat from the vicinity of the LED (s) to the heat sink or the fins thereof, where the heat can be transferred to the ambient environment with the aid of the synthetic jet ejector. In some embodiments, a heat spreader or heat pipe may be utilized which extends into the fins of the heat sink.

The fins in the heat sinks described herein may be formed through the use of various processes including, for example, through extrusion, die casting, skiving or swaging. They may also be formed from various materials including, but not limited to, aluminum, copper and other metals.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A light source, comprising:

an LED module having first, second and third surfaces;

a synthetic jet ejector disposed upon, or adjacent to, said first surface;

a light-emitting region disposed on said second surface; and a heat sink disposed on said third surface, said heat sink comprising a plurality of fins and having a plurality of channels formed by adjacent fins;

wherein said synthetic jet ejector operates to direct each of a plurality of synthetic jets along the longitudinal axis of one of said channels.

2. The light source of claim 1, wherein said LED module comprises an LED housing having an LED disposed therein, and wherein said first, second and third surfaces of said LED module are surfaces of said LED housing.

3. The light source of claim 2, wherein said synthetic jet ejector is spaced apart from said first surface.

4. The light source of claim 2, wherein said synthetic jet ejector is disposed on said first surface.

5. The light source of claim 2, wherein said first and third surfaces are essentially planar, and wherein the planes of said first and third surfaces intersect at an angle within the range of about 75° to about 105°.

6. The light source of claim 2, wherein said first and third surfaces are essentially planar, and wherein the planes of said first and third surfaces are essentially orthogonal.

7. The light source of claim 1, wherein said LED module is essentially polyhedral in shape.

8. The LED light source of claim 1, wherein said LED module is essentially prismatic in shape.

9. The light source of claim 1, wherein said synthetic jet ejector is essentially tabular in shape.

10. The light source of claim 1, wherein said synthetic jet ejector terminates about at least a portion of its periphery in at least one arcuate section.

11. The light source of claim 10, wherein said at least one arcuate section has a plurality of apertures therein.

12. The light source of claim 11, wherein said at least one arcuate section extends over said heat sink such that each of said plurality of apertures is positioned over one of said channels.

13. The light source of claim 1, wherein said synthetic jet ejector comprises lower and upper essentially polyhedral portions, wherein said upper portion has a larger major surface than said lower portion, and wherein said lower portion extends into the center of said heat sink.

14. The light source of claim 1, wherein said synthetic jet ejector comprises first and second synthetic jet actuators arranged in parallel.

15. The light source of claim 1, wherein said synthetic jet ejector extends over said LED module and said heat sink.

16. The light source of claim 15, wherein said synthetic jet ejector is equipped about its periphery with a plurality of apertures.

17. The light source of claim 16, wherein each of said plurality of apertures is disposed over one of said channels.

18. The light source of claim 17, wherein each of said plurality of channels is essentially perpendicular to said first surface.

19. The light source of claim 1, wherein the LED module is equipped with a port which allows it to be connected to a power source.

20. A light source, comprising:

an LED module having first, second and third surfaces;

a synthetic jet ejector disposed upon, or adjacent to, said first surface;

a light-emitting region disposed on said second surface; and a heat sink disposed on said third surface, said heat sink comprising a plurality of fins and having a plurality of channels formed by adjacent fins;

wherein said synthetic jet ejector operates to generate a plurality of synthetic jets, and wherein each of said plurality of synthetic jets is directed along the longitudinal axis of one of said channels.

21. The light source of claim 1, wherein said first and second surfaces are major opposing surfaces.

22. The light source of claim 1, wherein said light emitting region emits light in a direction away from said first surface.

23. The light source of claim 1, wherein said synthetic jet ejector emits a plurality of synthetic jets in a direction parallel to said third surface and perpendicular to said second surface.

24. The light source of claim 1, wherein said first and second surfaces are major opposing surfaces, wherein said synthetic jet ejector is disposed upon said first surface and emits a plurality of synthetic jets in a direction parallel to said third surface, and wherein said light emitting region emits light in a direction away from said first surface.

25. The light source of claim 24, wherein said first and second surfaces are rectangular.

26. The light source of claim 24, wherein said synthetic jet ejector has first and second major opposing surfaces, and wherein the second major surface of said synthetic jet ejector is larger than the first major surface of said synthetic jet ejector.

27. The light source of claim 26, wherein said synthetic jet ejector is T-shaped in a cross-section taken in at least one plane that is perpendicular to said first and second major surfaces of said synthetic jet ejector.

28. The light source of claim 26, wherein said synthetic jet ejector has an arcuate portion which extends over said heat sink, and wherein said arcuate portion is equipped with a plurality of apertures which emit said plurality of synthetic jets.

* * * * *